United States Patent [19]
Sullivan
[11] 4,158,790
[45] Jun. 19, 1979

[54] HIGH INTENSITY ATOMIC SPECTRAL LAMP WITH INTERCHANGEABLE CATHODE

[75] Inventor: John V. Sullivan, Carnegie, Australia

[73] Assignee: Commonwealth Scientific and Industrial Research Organization, Campbell, Australia

[21] Appl. No.: 804,475

[22] Filed: Jun. 7, 1977

[30] Foreign Application Priority Data

Jun. 7, 1976 [AU] Australia ............................ PC6196

[51] Int. Cl.[2] ......................... H01J 1/94; H01J 37/34; H01J 61/06; H01J 61/52

[52] U.S. Cl. ................................ 313/231.6; 313/192; 313/237; 356/314

[58] Field of Search ..................... 313/231.6, 209, 210, 313/231.3, 231.4, 362, 237, 188, 192; 356/86, 85

[56] References Cited

U.S. PATENT DOCUMENTS

| | | | |
|---|---|---|---|
| 3,433,963 | 3/1969 | Walsh et al. | 313/209 X |
| 3,517,188 | 6/1970 | Sullivan et al. | 356/86 X |
| 3,635,561 | 1/1972 | Bordonali et al. | 356/85 |
| 3,699,383 | 10/1972 | Chaney | 356/86 X |
| 3,869,643 | 3/1975 | Okagaki | 313/209 X |

FOREIGN PATENT DOCUMENTS

| | | | |
|---|---|---|---|
| 967047 | 8/1964 | United Kingdom | 356/86 |

*Primary Examiner*—Palmer C. Demeo
*Attorney, Agent, or Firm*—Sughrue, Rothwell, Mion, Zinn and Macpeak

[57] ABSTRACT

A high intensity atomic spectral lamp having a first set of electrodes including a primary cathode consisting of or comprising a selected element adapted to produce a primary electric discharge which gives rise to an atomic vapor of said element by cathodic sputtering from the primary cathode; a second set of electrodes adapted to produce a secondary electric discharge which passes through the said atomic vapor, to excite the atoms in the vapor to emit radiation characteristic of said element; a window to allow the passage of said radiation out of the lamp, said window being placed in front of the operative surface of the primary cathode; means to pass a stream of inert gas through the lamp close to and across the operative surface of the primary cathode and between the primary cathode and the window in such manner as to sweep away from the vicinity of the primary cathode surface atomic species formed by said primary discharge.

The preferred form of the lamp includes demountable cathode support means to permit ready removal and replacement of the primary cathode.

16 Claims, 3 Drawing Figures

HIGH INTENSITY ATOMIC SPECTRAL LAMP WITH INTERCHANGEABLE CATHODE

Figure 1:
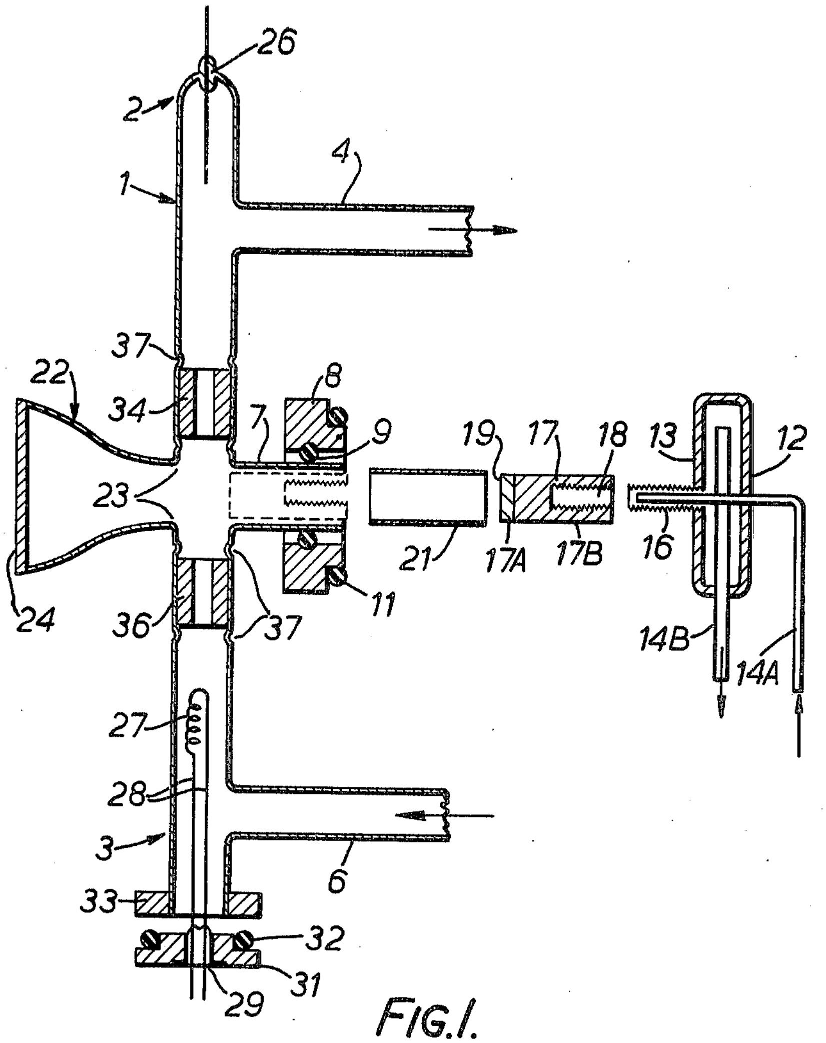

This invention is concerned with an improved form of high intensity atomic spectral lamp.

The principal type of atomic spectral lamp at present in use is the hollow cathode discharge lamp, in which the cathode is shaped in the form of a hollow cylinder and is made of a material which consists wholly or partly of the elements of which the atomic spectrum is to be obtained. This type of lamp suffers from the principal disadvantage that the electrical discharge between the anode and cathode serves to generate or produce an atomic vapour by sputtering from the cathode, and also to supply the excitation, which is necessary for the production of atomic spectra, to at least some of the atoms in the vapour. These two functions of the discharge cannot be separately controlled, and a variation in one parameter of the discharge, e.g. current or pressure, will affect both functions. The amount of atomic vapour produced must be limited to relatively small quantities if the widths of the spectral lines are not to be increased by self-absorption and resonance broadening. Thus the discharge current that can be used, and therefore the degree of excitation that can be imparted to the atomic vapour, are similarly limited. Consequently the intensities of the spectra emitted by such discharge lamps are limited if sharp lines are required.

Our prior Australian Pat. Nos. 260,726 and 289,307 described forms of high intensity atomic spectral lamp in which the atomic vapour of an element was generated by a first electrical discharge giving rise to cathodic sputtering and this vapour was then excited by a means of a second independent discharge to thereby increase the radiation emitted by the lamp, in comparison with ordinary cathode sputtering lamps, without incurring significant line broadening. A further modification of this type of lamp is described in our Australian Pat. No. 295,985, the lamp described therein producing atomic vapour by thermal means rather than by cathodic sputtering. Such prior art high intensity lamps have found significant applications in the field of atomic adsorption spectroscopy although they still share with ordinary hollow cathode lamps the disadvantage that one lamp is required for each element to be determined.

Most prior art lamps, whether of the normal or high intensity type generally conform to one basic configuration in which the lamp envelope is of elongated tubular shape, with a flat optical window at one end, the hollow cathode being situated at or near the other end of the tube and facing the window. In the high intensity type of lamp the second set of electrodes which provide the exciting discharge are usually arranged to be diametrically opposed across the long axis of the lamp and close to the mouth of the hollow cathode. Other arrangements are, of course, possible but the principal criterion of any such lamp is that the window must be fairly remote from the hollow cathode in order to minimise the amount of cathode material which is deposited on the window as a result of cathodic sputtering. Even so, after a long period of operation, windows of most lamps, particularly those used for producing the spectra of fairly volatile elements become coated with a sputtered film of the element and lose their usefulness. In lamps of the sealed off type, which are the most common, another problem is that clean-up of the filler gas inevitably occurs thereby limiting the useful lifetime of the lamp.

Another difficulty which is encountered with our earlier high intensity lamps, e.g. of the type described in Australian Pat. Nos. 260,728 and 289,307, is that there is substantial interaction between the primary discharge, which produces the atomic vapour, and the secondary (exciting) discharge. It is found, in fact, that if the secondary discharge current exceeds about 80 to 100 mA the light output of the lamp actually falls off, due to effective lowering of the voltage across the primary discharge electrodes.

While the prior art high intensity lamps have been used with some success for atomic fluorescence spectroscopy, they are by no means ideal for this purpose. Because of the configuration of the lamps as described above, they essentially have a small numerical aperture. This coupled with the fact that they cannot be run at their maximum light output reduces the useful intensity of radiation which they provide to the point where it may not be sufficient to enable satisfactory use of atomic fluorescence techniques.

The principal objects of the present invention can therefore be stated as the provision of a high intensity atomic spectral lamp having at least one and preferably all of the following features:

1. Low or minimal interaction between the primary and secondary discharges.
2. Provision for interchangeable cathodes.
3. The capability of working at optimum filler gas pressure for maximum light output, without compromising service life.
4. High numerical aperture.

Barnes Engineering Company of Stamford, Conn., U.S.A., have produced a demountable, hollow cathode, atomic spectral lamp which includes a gas flow-through system but the design of the lamp is essentially conventional, having an elongate tubular body with a window at one end and the hollow cathode at the other.

In the Barnes lamp, the flow direction of the gas is from the cathode towards the window, which inevitably will lead to deposition of the sputtered cathode material on to the window.

The use of gas flow through systems is also described in our Australian Pat. No. 414,987, and patent application No. 59106/73 which are concerned with a type of apparatus (now known as a "sputtering chamber") in which an atomic vapour is produced by a sputtering discharge from a replaceable cathode comprising a solid sample in a chamber through which a constant flow of gas is passing. This arrangement allows contaminants, introduced by the opening of the chamber to exchange cathodes, to be removed from the chamber and also avoids "clean-up" problems. Particularly in the system described in our patent application No. 59106/73, the cathode has a comparatively large area and this necessitates the use of a rather complicated "arrester" to control both the discharge characteristics and the gas flow which is directed essentially from and perpendicularly away from the face of the cathode. Gas pressure and flow-rate are also critical in this system and must be carefully controlled.

It should be noted that in the sputtering chamber the cathode is the sample under test and the object is to ensure the production of an atomic vapour from the sample which is properly representative in composition of the sample.

A sputtering chamber is not designed or intended to produce emitted radiation. A high intensity spectral lamp on the other hand is essentially a spectral source, for which it is often desirable that the cathode be as pure as possible, for example in atomic fluorescence work. This therefore implies the use of a cathode of relatively small area.

The present invention is concerned with a high intensity lamp of an entirely new configuration which utilizes both the flow-through principle and a demountable cathode system and, which, by virtue of its design, maximises the advantages to be obtained from these features.

According to the present invention there is provided a high intensity atomic spectral lamp having a first set of electrodes including a primary cathode consisting of or comprising a selected element adapted to produce a primary electric discharge which gives rise to an atomic vapour of said element by cathodic sputtering from the primary cathode; a second set of electrodes adapted to produce a secondary electric discharge which passes through the said atomic vapour, to excite the atoms in the vapour to emit radiation characteristic of said element; a window to allow the passage of said radiation out of the lamp, said window being placed in front of the operative surface of the primary cathode; means to pass a stream of inert gas through the lamp close to and across the operative surface of the primary cathode and between the primary cathode and the window in such manner as to sweep away from the vicinity of the primary cathode surface atomic species formed by said primary discharge.

Preferably the window is substantially parallel to the operative surface of the primary cathode and the gas stream also passes substantially parallel to that surface.

It is further preferred that the lamp includes demountable cathode support means to permit ready removal and replacement of the primary cathode.

A principal feature of the lamp of the invention is thus the use of a gas flow to sweep atomic vapour sputtered from the primary cathode away from the area between the cathode and the window in a direction substantially parallel to the window. This arrangement permits the window to be relatively close to the front surface of the primary cathode and thus subtend a relatively large angle at the cathode surface. This enables the provision of high numerical aperture with a window of relatively small diameter, while still minimizing deposition of sputtered material on the window.

In one preferred embodiment the high intensity lamp of the present invention comprises an elongate, generally tubular body portion with the primary cathode mounted in the wall of the body portion; the secondary cathode and common anode being mounted within the body portion and arranged to direct the second discharge across and through a region in front of the primary cathode; and gas inlet and outlet means arranged to pass a stream of gas through said region in a generally axial direction with respect to the body portion and in the direction of the secondary discharge.

More specifically, the preferred lamp of the invention comprises:

- a generally tubular body portion having gas inlet and outlet means to allow a flow of gas through the body portion in a generally axial direction;
- a cathode compartment located in the wall of the body portion;
- primary cathode means located in said compartment and comprising a primary cathode and demountable primary cathode support means adapted to allow the first cathode to be readily removed from and replaced in said compartment;
- window means attached to the wall of the body portion, said window means comprising a chamber in open communication with an aperture in the wall of the body portion diametrically opposite the cathode compartment and an optical window at the end of the chamber remote from the aperture;
- a secondary cathode located within the body portion and spaced away from the cathode compartment;
- a common anode located within the body portion and spaced away from the cathode compartment in the opposite direction to the secondary cathode.

The body portion is preferably of reduced diameter in at least part of those portions of the body which lie between the cathode compartment and the secondary cathode and anode respectively. This arrangement helps to increase the current density of the secondary discharge and therefore the degree of excitation of the atomic vapour.

Preferably the optical window is of substantially larger diameter than the said aperture or the primary cathode, thereby to provide a high numerical aperture.

Preferably also, the primary cathode has a substantially flat front face and the arrangement of the cathode compartment and supporting means is such that in use the flat face of cathode is substantially flush with the inside wall of the body portion adjacent the cathode compartment. The use of the flat-faced cathode permits higher operating voltages for the primary discharge (up to about 550V) as compared with a hollow cathode (about 200V). This further contributes to minimising interaction between the discharges.

It is further preferred that the secondary cathode is of the electrically heated (filament) type and/or is coated with a thermionically emissive material. The preferred coating material is lanthanum hexaboride which is stable to repeated exposure to air. To facilitate replacement of the secondary cathode, when necessary, it is preferred that the secondary cathode is supported on supporting means which can be removed from and replaced in the body portion.

The invention will be further described and elucidated in the following description.

FIG. 1 is a diagrammatic cross-section of one specifically preferred lamp constructed in accordance with the invention.

Figure 2A:
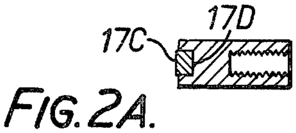
Figure 2B:
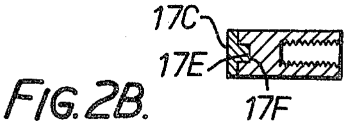

FIGS. 2*a* and 2*b* are cross-sectional views of modified forms of the cathode.

In the drawing, the body portion of the lamp consists of a tube 1 which is sealed at one end 2 and open at the other end 3. Near the ends 2 and 3 side arms 4 and 6 are provided for gas outlet and inlet respectively. The central part of the tube 1 has a further side arm which forms the cathode compartment 7.

The free (outer) end portion of the cathode compartment 7 is open and is surrounded by a metal ring 8 which has internal and external circumferential grooves to accommodate O-rings, 9 and 11 respectively. In use, the ring 8 and O-rings 9 and 11 act as sealing means for the cathode support means. The latter comprises a hollow metal block 12 having a flat face 13 and provided with an inlet pipe 14A and outlet pipe 14B to allow the flow of cooling water through the block.

In the face 13 of the block 12, there is a centrally-located, protruding, hollow, threaded spigot 16. The inlet pipe 14A has its outlet within the spigot 16 so that the cooling water is first directed into the spigot to maximise the cooling of the spigot and hence, the attached cathode.

The demountable cathodes (of which one is shown at 17) have a corresponding threaded socket 18 in their base to engage with spigot 16. The cathode 17 has a flat front face 19. The cathode may consist entirely of the element whose spectrum is to be produced or it may consist of a relatively thin disc, plate or pellet (shown as 17A) of the element which is mounted on the main body (17B) of the cathode which may be made of any suitable metal.

As shown in FIG. 2A, one form of cathode consists of a pellet 17C of the element whose spectrum is to be determined which is of smaller diameter than the main body 17B of the cathode and is press-fitted into a recess 17D in the body 17B.

A specifically preferred arrangement is shown in FIG. 2B where the cathode consists of a stepped pellet 17C having a circular boss 17E of smaller diameter which is a press-fit into a recess 17F in the body 17B.

These arrangements enable the body 17B to be made of a relatively low cost material, where the material of the cathode pellet (17A or 17C) is an expensive or rare material and also allows intractable elements to be fabricated into cathode pellets by powder metallurgical techniques.

In use the cathode 17 is screwed to the block 12 and a tubular sheath 21 of silica or any other suitable insulating material is slid over the cathode before the latter is inserted into the compartment 7 until the flat face 13 of the block 12 rest against O-ring 11. Once the lamp is sealed and the pressure within the lamp reduced, the external air pressure holds the block 12 firmly in place with the flat face 19 of the cathode flush with the internal wall of the tube 1, as shown by the dashed lines in the drawing.

Opposite the cathode compartment 7 a chamber 22 is mounted outside, and in open communication with the tube 1, via aperture 23. The chamber 22 tapers outwardly from the aperture 23 and terminates in window 24 of optical quality quartz. Typically the window 22 is about four times the diameter of the cathode 17.

The common anode, which consists of a metal wire 26, is mounted in the sealed end 2 of tube 1 by means of a conventional glass-to-metal seal.

The secondary cathode consists of a coiled rhenium wire filament 27 which is coated with lanthanum hexaboride. The filament 27 is supported on two metal lead-in wires 28 which pass through an insulating button 29 in a metal plate 31.

The plate 31 is grooved to accommodate an O-ring 32 which in use abuts and seals to a metal sealing ring 33 which surrounds the open end of tube 1. This arrangement allows for ready demounting and replacement of the secondary cathode in the event of failure.

Two sleeves consisting of short lengths 34, 36 of narrow bore silica tubing are located in the tube 1 on each side of the cathode compartment 7 by dimples 37 formed in the walls of the tube 1. These sleeves help to control the secondary discharge and maintain the required gas flow through to the central part of the tube 1.

In using the lamp, the gas outlet 4 is connected to a suitable vacuum pump and the gas inlet 6 to a controlled supply of an inert flowing gas such as argon. The primary cathode holder 12 with the cathode 17 in position, and the secondary cathode assembly (29–33) are placed in position. Clamping means may be used to lock the two assemblies in position initially to avoid accidental dislodgement. The lamp is then pumped down and the inert gas flow started to flush air out of the lamp. After stabilization of the lamp pressure at the required level, the primary discharge is ignited between the primary cathode 17 and anode 26. The electric supply to the filament 27 is then turned on and the secondary discharge is ignited between the secondary cathode 27 and anode 26. After allowing sufficient time for degassing and cleaning up of the various elements, the lamp is ready for operation. This start up time varies with a number of factors, especially the cleanliness of the primary cathode but is generally of the order of 1½–2 minutes.

All of the above described operations from commencement of pumping down can be controlled by automatic sequencing devices of the type known per se in the art. It is also envisaged that with appropriate modifications of the cathode holder, automatic exchange of the primary cathode can also be employed.

Typical dimensions and operating conditions for the lamp are as follows:

| | |
|---|---|
| Diameter of tube 1 | 12mm |
| Diameter of Cathode 7 | 8mm |
| Diameter of window 24 | 30mm |
| Primary discharge voltage | 500–600V |
| Primary discharge current | 10mA |
| Secondary discharge voltage | 30V |
| Secondary discharge current | 500mA |

The above described lamp provides a very intense source of atomic spectra and the large numerical aperture (which can easily be as high as f/1) provided by the window 24 makes it ideal for atomic fluorescence work. In such work, use of the lamps of the invention can yield detection limits comparable with those obtainable with electrodeless discharge lamps, i.e. much higher than the limits attainable with ordinary sealed off high intensity lamps. This is because the lamps of the invention, due to the flow-through, filler gas system used, can operate continuously at the optimum gas pressure for maximu light output (i.e., of the order of 1–2 Torr.). In sealed-off lamps the filler gas pressure is a compromise dictated by life-time considerations and is thus far from idea. A sealed off lamp filled at 1–2 Torr. would have a very short lifetime due to clean-up, but this problem is eliminated by the flow-through system.

The lamp of the present invention can also be used as a hollow cathode lamp having a replaceable hollow cathode. In this case, the cathode 17 is replaced by a hollow cathode and the lamp is operated without the secondary discharge.

I claim:

1. A high intensity atomic spectral lamp having a hollow body, a first set of electrodes located in said body including a primary cathode comprising a selected element adapted to produce a primary electric discharge which gives rise to an atomic vapour of said element by cathodic sputtering from the primary cathode; a second set of electrodes located in said body adapted to produce a secondary electric discharge which passes through said atomic vapour, to excite the atoms in the vapour to emit radiation characteristic of said element; a window in said body to allow the passage of said radiation out of the lamp, said window being placed in front of and substantially parallel to the operative surface of the primary cathode; a gas inlet and outlet means in said body to pass a stream of inert gas through said body of said lamp transversely across and substantially parallel to the operative surface of the primary cathode and between the primary cathode and the window in such a manner as to sweep away from the area between the primary cathode surface and the window atomic species formed by said primary discharge.

2. A lamp as claimed in claim 1, wherein the window is substantially parallel to the operative surface of the primary cathode and the gas stream also passes substantially parallel to that surface.

3. A lamp as claimed in claim 1, which includes demountable cathode support means to permit ready removal and replacement of the primary cathode.

4. A lamp as claimed in claim 1, comprising an elongate, generally tubular body portion having the primary cathode mounted in the wall of the body portion; the secondary cathode and common anode being mounted within the body portion and arranged to direct the second discharge across and through a region in front of the primary cathode; and gas inlet and outlet means arranged to pass a stream of gas through said region in a generally axial direction with respect to the body portion and in the direction of the secondary discharge.

5. A lamp as claimed in claim 1, comprising:

a generally tubular body portion having gas inlet and outlet means to allow a flow of gas through the body portion in a generally axial direction;

a cathode compartment located in the wall of the body portion;

primary cathode means located in said compartment and comprising a primary cathode and demountable primary cathode support means adapted to allow the primary cathode to be readily removed from and replaced in said compartment;

window means attached to the wall of the body portion, said window means comprising a chamber in open communication with an aperture in the wall of the body portion diametrically opposite the cathode compartment and an optical window at the end of the chamber remote from the aperture;

a secondary cathode located within the body portion and spaced away from the cathode compartment;

a common anode located within the body portion and spaced away from the cathode compartment in the opposite direction to the secondary cathode.

6. A lamp as claimed in claim 5, wherein the body portion is of reduced diameter in at least part of those portions of the body which lie between the cathode compartment and the secondary cathode and anode respectively.

7. A lamp as claimed in claim 5, wherein the optical window is of substantially longer diameter than said aperture of the primary cathode.

8. A lamp as claimed in claim 5, wherein the primary cathode has a substantially flat front face and the arrangement of the cathode compartment and supporting means is such that in use the flat face of cathode is substantially flush with the inside wall of the body portion adjacent the cathode compartment.

9. A lamp as claimed in claim 5, wherein the primary cathode consists of a disc plate or pellet of said element attached to or held in the supporting means.

10. A lamp as claimed in claim 1, wherein the secondary cathode is of the electrically heated (filament) type and/or is coated with a thermionically emissive material.

11. A lamp as claimed in claim 10, wherein the cathode coating material is lanthanum hexaboride.

12. A lamp as claimed in claim 10, wherein the secondary cathode is supported on supporting means which can be removed from and replaced in the body portion.

13. In a high intensity atomic spectral lamp comprising a body containing a first set of electrodes including a primary cathode comprising a selected element adapted to produce a primary electric discharge which gives rise to an atomic vapour of said element by cathodic sputtering from the primary cathode; a second set of electrodes adapted to produce a secondary electric discharge which passes through the said atomic vapour, to excite the atoms in the vapour to emit radiation characteristic of said element; and having a window placed in front of the operative surface of the primary cathode to allow the passage of said radiation out of the lamp, the improvements which comprise:

(a) at least a part of the body being in the form of a relatively narrow elongated tube;

(b) the primary cathode being positioned in a compartment located in said part of the body;

(c) said window being located diametrically opposite to and essentially parallel with the operative surface of the primary cathode, said window being of substantially greater diameter than either the primary cathode or said part of the body and being located at one end of a chamber, the other end of which is in open communication with said part of the body;

(d) said secondary cathode and a common anode being located in said part of the body one on each side and spaced away from the cathode compartment;

(e) gas inlet and outlet means being located at or near opposite ends of said part of the body to allow a flow of gas to be passed axially through said part close to and across the operative surface of the primary cathode and between the primary cathode and the window in such a manner as to sweep away from the vicinity of the primary cathode surface atomic species formed by said primary discharge.

14. In a high intensity lamp as claimed in claim 13, the further improvement which comprises demountable primary cathode support means adapted to allow the primary cathode to be readily removed from and replaced in said compartment.

15. In a high intensity lamp as claimed in claim 13, the further improvement which comprises demountable secondary cathode support means adapted to allow the secondary cathode to be readily removed from and replaced in the body portion.

16. In a high intensity lamp as claimed in claim 13, the further improvement which comprises sections of reduced diameter being located in said part of the body, which sections lie between the cathode compartment and the secondary cathode and anode respectively.

* * * * *